United States Patent [19]

Plies

[11] 4,439,685
[45] Mar. 27, 1984

[54] CORPUSCULAR BEAM BLANKING SYSTEM

[75] Inventor: Erich Plies, Munich, Fed. Rep. of Germany

[73] Assignee: Siemens Aktiengesellschaft, Berlin & Munich, Fed. Rep. of Germany

[21] Appl. No.: 290,473

[22] Filed: Aug. 6, 1981

[30] Foreign Application Priority Data

Sep. 29, 1980 [DE] Fed. Rep. of Germany ....... 3036659

[51] Int. Cl.³ .......................... G21K 1/08; H01J 3/14
[52] U.S. Cl. .................................. 250/398; 250/396 R
[58] Field of Search ........... 250/396 R, 396 ML, 305; 313/361

[56] References Cited

PUBLICATIONS

Karl Brack, Z. Naturforschung 17a (1962), pp. 1066–1070.
W. A. M. Hartl, Z. F. Phys. 191 (1966), pp. 487–502.

Primary Examiner—Bruce C. Anderson
Attorney, Agent, or Firm—Hill, Van Santen, Steadman & Simpson

[57] ABSTRACT

A corpuscular beam blanking system for generating high-frequency corpuscular pulses with monochromator effect utilizes a three-electrode Einzel-lens designed as a filter lens and which is employed as a blanking lens. A "breathing" effect of a probe spot of the corpuscular beam is avoided and a monochromator effect is achieved with a blanking pin-hole diaphragm positioned after the blanking lens.

7 Claims, 6 Drawing Figures $U=0$  $U=-U_0-\delta V$  $U=0$
$\varphi=U_0$  $\varphi=-\delta V$  $\varphi=U_0$

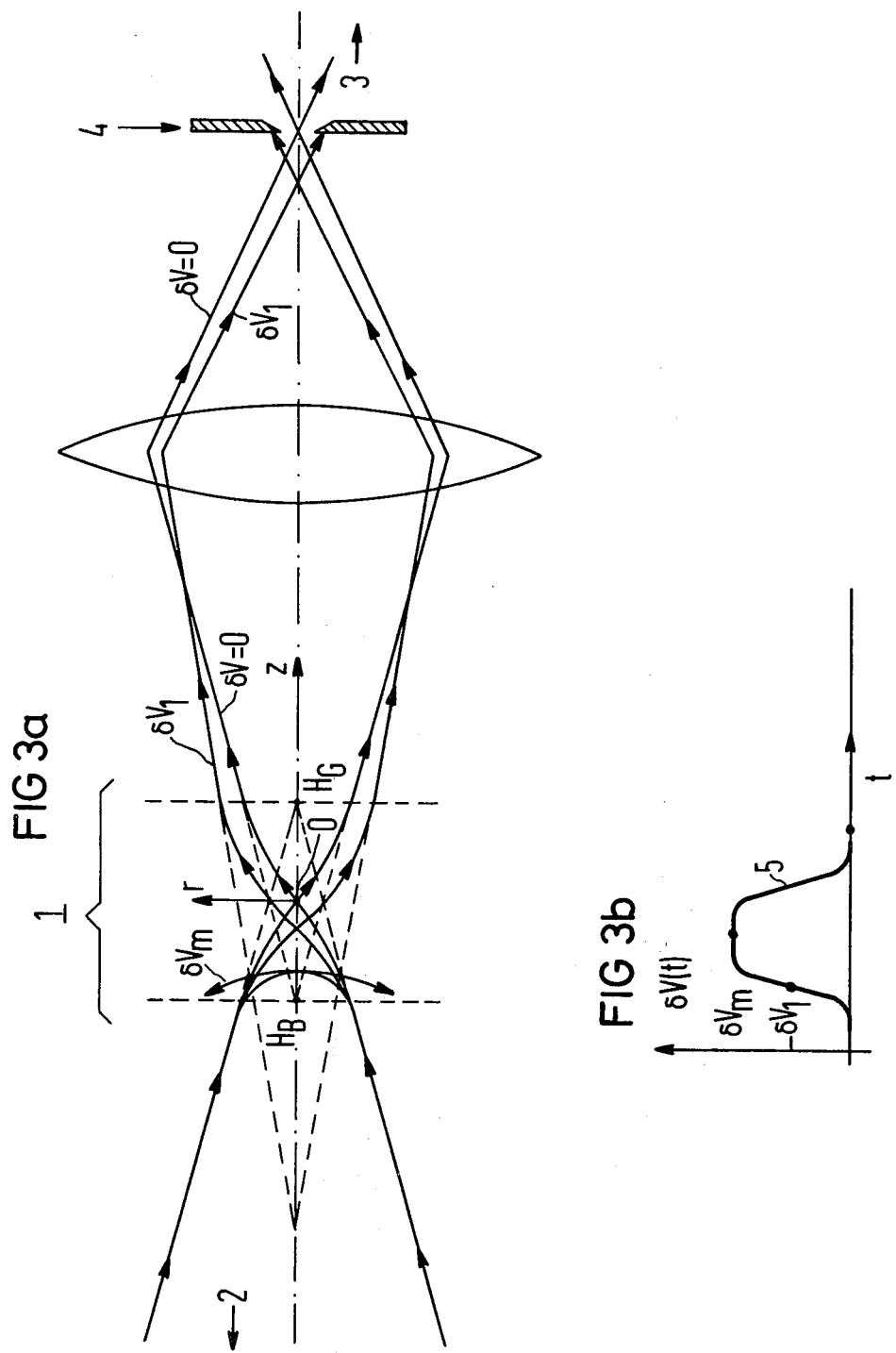

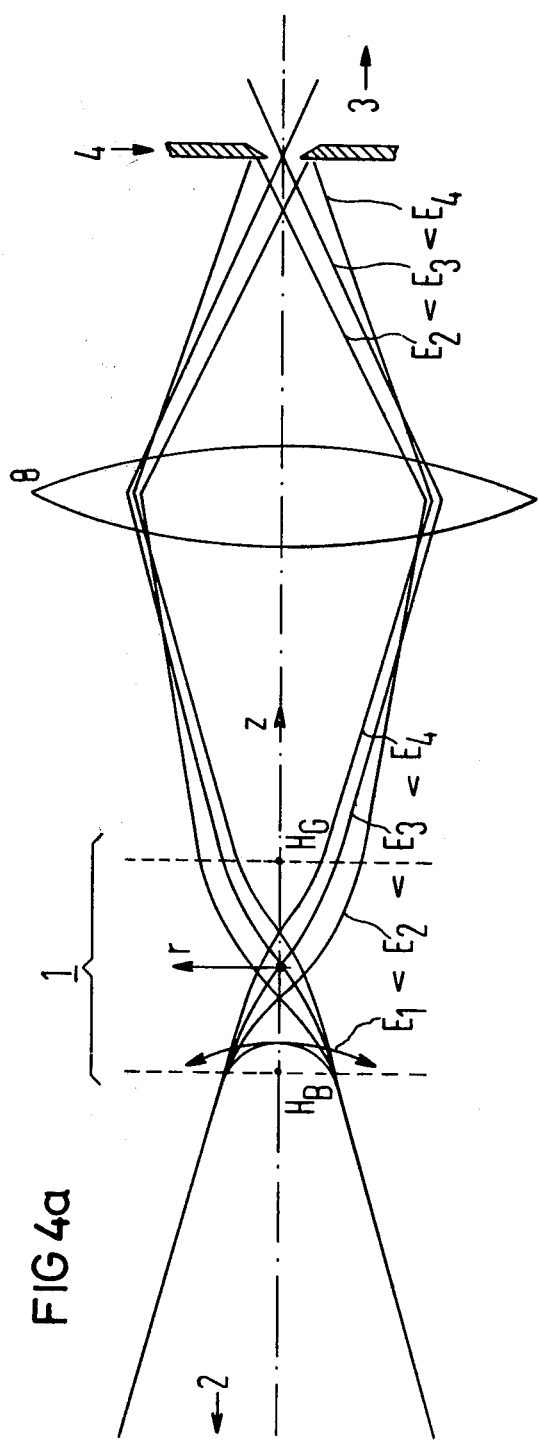
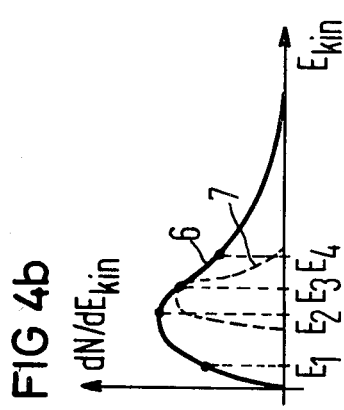
FIG 4a
FIG 4b

CORPUSCULAR BEAM BLANKING SYSTEM

BACKGROUND OF THE INVENTION

The invention relates to a corpuscular beam blanking system.

In writing with electrons or ions, the corpuscular beam must be unblanked and blanked according to the pattern to be exposed. In corpuscular beam measuring or testing units, the corpuscular beam is interrupted in pulse-like fashion with the assistance of a beam blanking system.

Until now, plate capacitors or traveling wave structures were usually employed for beam blanking.

SUMMARY OF THE INVENTION

An object of the invention is to provide a corpuscular beam blanking system for generating high-frequency corpuscular pulses.

This object is inventively achieved by means of an electrostatic three-electrode Einzel-lens as a blanking lens whose electrodes are shaped in the manner of a filter lens. The center electrode lying at high voltage has the blanking signal supplied to it via a capacitor. The blanking lens is inserted in the beam path in such manner that its object-side nodal point $K_G$ (here=the principal point $H_G$) coincides with the virtual source image. By means of a sufficiently negative auxiliary voltage at the center electrode, the corpuscular beam can be blocked. This blanking lens only effects a beam displacement, whereby the real source image lies in the center of the lens. On the basis of this beam path, the beam diameter within the lens is small and the lens can be dimensioned with small radial dimensions which results in a low capacitance of the lens. Estimates show that a capacitance below 3 pF is possible.

Advantageously, the electrodes are constructed in the manner of a filter lens so that a resulting potential saddle is as flat as possible in a radial direction. Then a slight voltage boost at the center electrode suffices in order to block the beam.

The cathode-related potential of the saddle point must not only be zero in blocking operation but rather must be slightly negative since the corpuscles have received a finite exit energy in the emission.

In the change-over range from transmission to blocking operation, the source image necessarily migrates on the optical axis in the direction of the source. When the source is imaged on the target, then this of necessity leads to "breathing" of the probe spot during blanking. This undesired enlargement of the probe spot is advantageously avoided when a blanking pin hole diaphragm or aperture is disposed in an intermediate image of the source (after the blanking lens). The diameter $d_{AB}$ of the blanking pin hole diaphragm or aperture is matched to the source diameter $d_Q$ according to $d_{AB}=M \cdot d_Q$, where M is the enlargement of the source up to the intermediate image. With the assistance of this blanking diaphragm, the diameter of the probe spot remains constant during the blanking operation—it is only the current strength which changes. The blanking diaphragm is superfluous when it is beam shaping diaphragms rather than the source image which are disposed after the blanking system and imaged onto the target.

In addition to the high-frequency blanking signal, a negative auxiliary dc voltage can also be advantageously applied to the center electrode so that one part of the low energy corpuscles are already filtered out in the lens during normal pass-mode operation.

The blanking pin-hole diaphragm simultaneously functions as an energy selection diaphragm due to the axial chromatic aberration of the blanking lens and the following lens, wherein the chromatic aberrations add up. The energy distribution of the corpuscles is again clipped by means of this blanking pin-hole diaphragm proceeding from the high-energy side and again from the low-energy side. The monochromator effect is particularly desirable when a high anomalous energy propagation (Boersch effect) has arisen in the beam generator. The energy width of the beam will not increase due to the Boersch effect in a similar manner after the filtration since the current strength is significantly smaller after filtration:

1. due to blanking between beam generator and blanking pin-hole diaphragm and
2. due to filtration of the corpuscles.

Moreover, after the blanking pin-hole diaphragm, the system only functions at full beam voltage so that the anomalous increase of the energy width also remains smaller.

BRIEF DESCRIPTION OF THE DRAWINGS

FIG. 3a shows the beam path in pass-mode operation, in blocking operation, and in the change-over region;

FIG. 3b shows the path of the corresponding blanking pulse; and

FIGS. 4a–b shows the reduction of the energy width due to the blanking lens with an additional blanking pin-hole diaphragm both for the beam path in pass-mode operation for electrons of various energy, and for an energy distribution before and after filtration.

DESCRIPTION OF THE PREFERRED EMBODIMENTS

Figure 1:
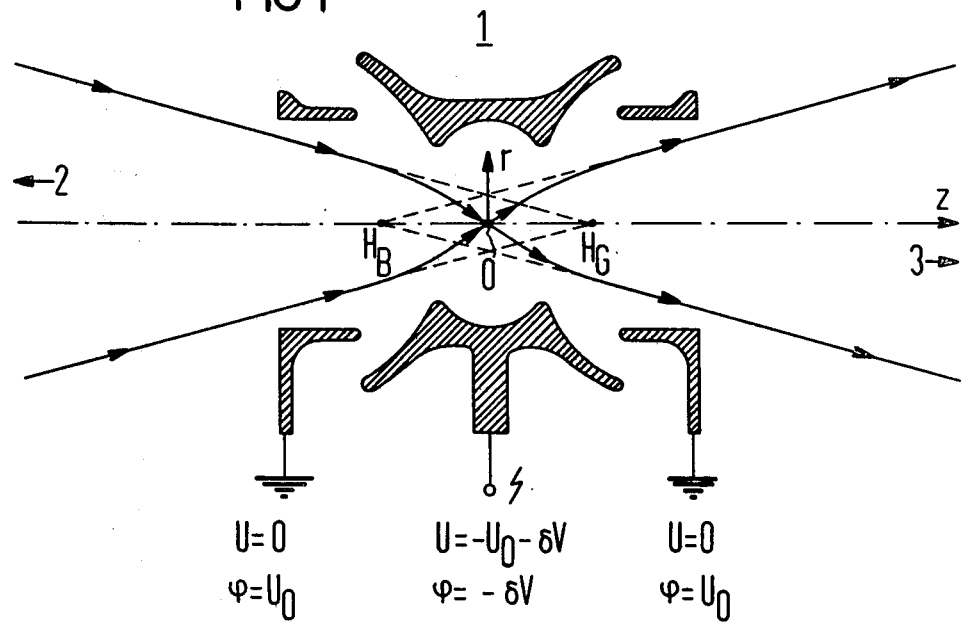
FIG. 1 is a schematic illustration of an electrostatic three-electrode beam blanking lens with its corresponding beam path during pass-mode operation.

FIG. 1 is a schematic illustration of an electrostatic three-electrode beam blanking lens with a corresponding beam path in pass-mode operation ($\delta V=$zero). The ordinate is greatly expanded. $H_G$ is the principal point of the object side; $H_B$ is the principal point of the image side; $\phi$ is the cathode-related potential; U is the anode-related potential; $U_o$ is the acceleration voltage; and $-\delta V$ is the electric beam blanking signal. The two outer electrodes lie at anode potential, whereas the cathode-related potential of the center electrode is controlled by the electrical beam blanking signal. The arrow referenced 2 points to the source and the part referenced 3 points to the target. A cylindrical coordinate system with the coordinates r and z is introduced. A third coordinate is not necessary because of the cylindrical symmetry of the arrangement. The origin of the coordinate system is referenced 0.

The blanking lens 1 is inserted into the beam path in such manner that its (object-side nodal point $K_G$—which is here identical to the object-side principal point $H_G$—coincides with the virtual source image. As can be seen from FIG. 1, the blanking lens 1 only effects a beam displacement, whereby the real source image lies in the lens center.

Figure 2:
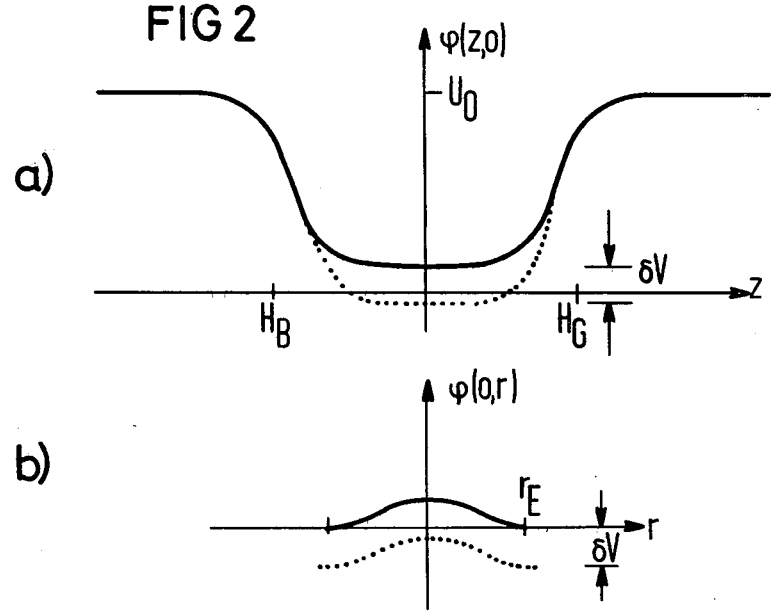
FIG. 2 shows the potential curves in the electrostatic blanking lens both along the optical axis and perpendicular to the optical axis in the center of the lens.

FIG. 2 shows the potential curves in the electrostatic blanking lens 1. FIG. 2a shows the potential curve along the optical axis and FIG. 2b shows the potential curve perpendicular to the optical axis in the lens center. Solid-line curves correspond to pass-mode operation and dot-dash curves correspond to blocking operation. The electrodes of the blanking lens 1 must be designed as a filter lens so that the potential saddle is as flat as possible in a radial direction. It is only then that a slight voltage boost of the center electrode suffices in order to block the beam. An electrode design of a filter lens is known from K. Brack, Z. Naturforschung 17a (1962), 1066 and from W. A. M. Hartl, Z. F. Phys. 191 (1966), page 487, incorporated herein by reference, in which the potential of the saddle point differs by only approximately 1 volt from the potential of the center electrode. This design is illustrated in FIG. 1. The inside radius of the electrode in the lens center is referenced $r_E$.

FIG. 3a shows the beam path in a pass-mode operation ($\delta V$=zero), in blocking operation ($\delta V = V_m$), and in the change-over region ($\delta V = V_1$). FIG. 3b shows the path of the corresponding blanking pulse with a voltage boost $\delta V_m$ for blocking operation and a voltage boost $V_1$ for the transition range. In the change-over region from pass-mode to blocking operation, the source image of necessity migrates on the optical axis in the direction of source 2. When the source 2 is imaged on the target 3, then this of necessity leads to "breathing" of the probe spot during the blanking operation. This undesired enlargement of the probe spot is avoided when the blanking pin-hole diaphragm 4 is disposed in an intermediate image of the source after the blanking lens. The diameter $d_{AB}$ of the blanking pin-hole diaphragm 4 is matched to the source diameter $d_Q$ according to $d_{AB}=Md_Q$ where M is the enlargement of the source 2 up to the intermediate image.

FIG. 4 shows the reduction of the energy width due to the blanking lens 1 with the additional blanking pin-hole diaphragm 4. FIG. 4a shows the beam path in pass-mode operation for corpuscles of various energy, and FIG. 4b shows the energy distribution before and after filtration. In addition to the high-frequency blanking signal, a negative auxiliary dc voltage can also be applied to the center electrode, so that a portion of the low-energy electrons are already filtered out in the blanking lens 1 in normal pass-mode operation. FIG. 4a shows that corpuscles with energy $E_1$ are filtered out in this manner. The blanking pin-hole diaphragm 4 simultaneously functions as an energy selection diaphragm due to the axial chromatic aberration of the blanking lens 1 and of the following lens 8 such that the axial chromatic aberrations add up. The blanking diaphragm 4 does not allow corpuscles with a relatively low energy $E_2$ and with a relatively high energy $E_4$ to pass. In FIG. 4b, the energy distribution 6 before filtration and the energy distribution 7 after filtration are illustrated. The energy distribution of the corpuscles is clipped by the blanking diaphragm 4 proceeding from the high-energy side and again proceeding from the low-energy side. The monochromator effect is particularly desirable when a high anomalous increase of the energy width (Boersch effect) has arisen in the beam generator. It is not to be expected that the energy width 7 is again greatly increased after filtration in a similar manner due to the Boersch effect since the current strength is significantly smaller. Moreover, the system only functions after arrival of the blanking diaphragm 4 at full beam voltage so that the anomalous increase of the energy width also remains smaller.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A corpuscular beam blanking system, comprising: a source; a target; an electrostatic three-electrode Einzel-lens as a blanking lens between the source and target whose electrodes are designed in the manner of a filter lens; a center electrode of the Einzel-lens being provided at a high voltage and having a blanking signal supplied to it via a capacitor; and said blanking lens being inserted in the beam path in such manner that a nodal point $K_G$ (here$\equiv$principal point $H_G$) of a target side coincides with a virtual source image of the system.

2. A corpuscular beam blanking system according to claim 1 wherein the blanking lens has small radial dimensions and a low capacitance.

3. A corpuscular beam blanking system according to claim 1 wherein a potential saddle of the blanking lens is substantially flat in a radial direction.

4. A corpuscular beam blanking system according to claim 3 wherein a cathode-related potential of a saddle point of the saddle is slightly negative in blocking operation.

5. A corpuscular beam blanking system according to claim 1 wherein a blanking pin-hole diaphragm is disposed after the blanking lens at an intermediate image of the source such that a diameter $d_{AB}$ of the blanking diaphragm is matched to a source diameter $d_Q$ according to $d_{AB}=M \cdot d_Q$ where M is an enlargement of the source up to the intermediate image.

6. A corpuscular beam blanking system according to claim 1 wherein a beam-shaping diaphragm is positioned after the blanking lens and before the target.

7. A corpuscular beam blanking system according to claim 1 wherein a negative auxiliary dc voltage is also applied to the center electrode of the blanking lens.

* * * * *